US010002956B1

(12) United States Patent
Lin et al.

(10) Patent No.: US 10,002,956 B1
(45) Date of Patent: Jun. 19, 2018

(54) HIGH ELECTRON MOBILITY TRANSISTOR

(71) Applicant: Vanguard International Semiconductor Corporation, Hsinchu (TW)

(72) Inventors: Shin-Cheng Lin, Tainan (TW); Hsin-Chih Lin, Hsinchu (TW); Yung-Hao Lin, Jhunan Township (TW); Chia-Ching Huang, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days. days.

(21) Appl. No.: 15/692,415

(22) Filed: Aug. 31, 2017

(51) Int. Cl.
*H01L 29/10* (2006.01)
*H01L 29/66* (2006.01)
*H01L 29/12* (2006.01)
*H01L 29/778* (2006.01)
*H01L 21/02* (2006.01)
(Continued)

(52) U.S. Cl.
CPC ...... *H01L 29/7786* (2013.01); *H01L 29/1029* (2013.01); *H01L 29/66462* (2013.01); *H01L 21/0254* (2013.01); *H01L 21/02381* (2013.01); *H01L 21/02458* (2013.01); *H01L 21/02507* (2013.01); *H01L 29/122* (2013.01); *H01L 29/2003* (2013.01); *H01L 29/207* (2013.01); *H01L 29/66431* (2013.01); *H01L 29/778* (2013.01); *H01L 29/7782* (2013.01); *H01L 29/7783* (2013.01); *H01L 29/7784* (2013.01); *H01L 29/7785* (2013.01)

(58) Field of Classification Search
CPC ............ H01L 29/7786; H01L 29/1029; H01L 29/66462; H01L 29/122; H01L 29/66431; H01L 29/778; H01L 29/7782; H01L 29/7783; H01L 29/7784; H01L 29/7785
See application file for complete search history.

(56) References Cited

U.S. PATENT DOCUMENTS 8,212,289 B2 * 7/2012 Smith ................. H01L 27/0605
257/192
9,281,387 B2 * 3/2016 Briere ................... H01L 29/045
9,502,549 B2 * 11/2016 Ikoshi ................... H01L 29/407
(Continued)

FOREIGN PATENT DOCUMENTS

TW 201145403 A1 12/2011
TW M529274 U 9/2016

*Primary Examiner* — Ida M Soward
(74) *Attorney, Agent, or Firm* — Birch, Stewart, Kolasch & Birch, LLP

(57) ABSTRACT

A high electron mobility transistor includes a buffer layer disposed on a substrate. A barrier layer is disposed on the buffer layer. A channel layer is disposed in the buffer layer and is adjacent to the interface between the buffer layer and the barrier layer. A gate electrode is disposed on the barrier layer. A drain electrode is disposed on the barrier layer on a first side of the gate electrode. A source electrode is disposed on the barrier layer on a second side of the gate electrode. A first enhancement layer is disposed on the barrier layer and the channel layer between the gate electrode and the drain electrode and is not in direct contact with the gate electrode, the source electrode, or the drain electrode. The first enhancement layer is an N-type doped III-V semiconductor.

13 Claims, 7 Drawing Sheets

(51) Int. Cl.
  *H01L 29/20*  (2006.01)
  *H01L 29/207* (2006.01)

(56) References Cited

U.S. PATENT DOCUMENTS

| | | | |
|---|---|---|---|
| 9,837,522 B2* | 12/2017 | Prechtl | H01L 29/7787 |
| 2002/0030202 A1* | 3/2002 | Liu | H01L 29/7784 |
| | | | 257/194 |
| 2007/0241368 A1* | 10/2007 | Mil'shtein | H01L 29/42316 |
| | | | 257/192 |
| 2014/0225122 A1* | 8/2014 | Takeya | H01L 29/66666 |
| | | | 257/76 |
| 2014/0319532 A1* | 10/2014 | Werner | H01L 29/2003 |
| | | | 257/76 |
| 2015/0104911 A1* | 4/2015 | Prechtl | H01L 29/66462 |
| | | | 438/172 |
| 2017/0330843 A1* | 11/2017 | Hua | H01L 23/564 |

* cited by examiner

HIGH ELECTRON MOBILITY TRANSISTOR

BACKGROUND

Technical Field

The disclosure relates to a high electron mobility transistor (HEMT), and more particularly to a high electron mobility transistor with an enhanced current.

Description of the Related Art

High electron mobility transistors (HEMT) are widely applied in high-power semiconductor devices due to their many advantages, which include high breakdown voltage and high output voltage.

Traditionally, in order to enhance the two-dimensional electron gas (2DEG) concentration, the material concentration of high electron mobility transistors may be fine-tuned, and spacer structures may be added. Therefore, the two-dimensional electron gas is enhanced by band-structure modulation. At the same time, however, Coulomb scattering is also enhanced by the above method, and this can degrade electron mobility, meaning that the net current may not increase. In addition, process uniformity control is also a great challenge.

Although existing high electron mobility transistors have generally been adequate for their intended purposes, they have not been entirely satisfactory in all respects and need to be improved, especially the conducting current of high electron mobility transistors.

BRIEF SUMMARY

The present disclosure provides a high electron mobility transistor (HEMT). The high electron mobility transistor includes a buffer layer disposed on a substrate. The high electron mobility transistor includes a barrier layer disposed on the buffer layer. The high electron mobility transistor includes a channel layer disposed in the buffer layer adjacent to an interface between the buffer layer and the barrier layer. The high electron mobility transistor includes a gate electrode disposed on the barrier layer. The high electron mobility transistor includes a drain electrode disposed on the barrier layer on a first side of the gate electrode. The high electron mobility transistor includes a source electrode disposed on the barrier layer on a second side of the gate electrode. The first side is opposite the second side. The high electron mobility transistor includes a first enhancement layer, disposed on the barrier layer and the channel layer between the gate electrode and the drain electrode, and not in direct contact with the gate electrode, the source electrode, or the drain electrode. The first enhancement layer is an N-type doped III-V semiconductor.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

Figure 1:
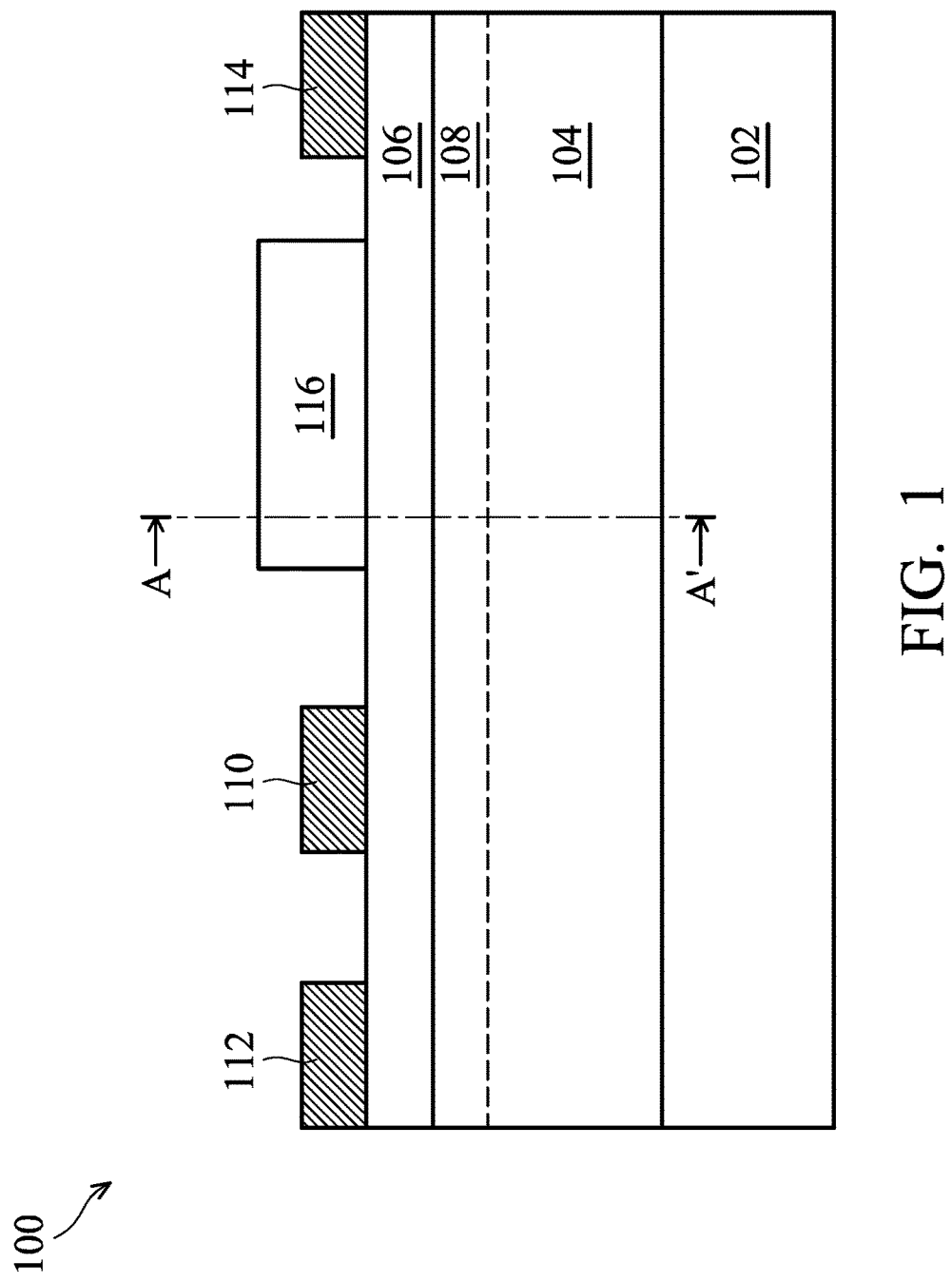
FIG. 1 is a cross-sectional representation of a high electron mobility transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a high electron mobility transistor (HEMT) in which an enhancement layer is formed between the gate electrode and the drain electrode. The enhancement layer deepens the depth of the quantum well, so that the two-dimensional electron gas (2DEG) concentration in the channel layer is increased, and then the conducting current is improved.

FIG. 1 is a cross-sectional representation of a high electron mobility transistor 100 in accordance with some embodiments of the present disclosure. As shown in FIG. 1, a substrate 102 is provided. The substrate 102 may include Si, SiC, or $Al_2O_3$ (sapphire). The substrate 102 may be a single-layer substrate, a multi-layer substrate, a gradient substrate, another suitable substrate, or a combination thereof. In some embodiments, the substrate 102 may also include a semiconductor on insulator (SOI) substrate. The above SOI substrate may include a base plate, a buried oxide (BOX) layer disposed on the base plate, or a semiconductor layer disposed on the buried oxide (BOX) layer.

Next, a buffer layer 104 is formed on the substrate 102. In some embodiments, the buffer layer 104 includes an undoped III-V semiconductor, like undoped GaN. In some embodiments, the buffer layer 104 is formed on the substrate 102 by molecular-beam epitaxy (MBE), metalorganic chemical vapor deposition (MOCVD), chemical vapor deposition (CVD), hydride vapor phase epitaxy (HVPE), another suitable method, or a combination thereof.

Next, a barrier layer 106 is formed on the buffer layer 104. In some embodiments, the barrier layer includes an undoped III-V semiconductor, like undoped AlGaN. In some embodiments, the thickness of the barrier layer 106 is between 0.1 µm and 5 µm. In some embodiments, the barrier layer 106 is formed on the buffer layer 104 by molecular-beam epitaxy (MBE), metalorganic chemical vapor deposition (MOCVD), chemical vapor deposition (CVD), hydride vapor phase epitaxy (HVPE), another suitable method, or a combination thereof.

Since the material band gaps of the buffer layer and the barrier layer are different, a heterojuction is formed at the interface between the buffer layer 104 and the barrier layer 106. Due to band bending at the heterojunction, a quantum well is formed where the conduction band deeply bends. The electrons produced by piezoelectricity are confined in the quantum well. Therefore, a two-dimensional electron gas (2DEG) is formed at the interface between the buffer layer 104 and the barrier layer 106, therefore a conducting current is formed. As shown in FIG. 1, the channel layer 108 is formed at the interface between the buffer layer 104 and the barrier layer 106. The channel layer 108 is where the conducting current is formed by the two-dimensional electron gas (2DEG). The thickness of the channel layer 108 is between 0.1 µm and 1 µm.

Next, a gate electrode 110, a source electrode 112, and a drain electrode 114 are formed on the barrier layer 106. The source electrode 112 and the drain electrode 114 are disposed on the opposite sides of the gate electrode 110. In some embodiments, the gate electrode 110 may include metal, polysilicon, metal silicide, other suitable conductive material, or a combination thereof. In some embodiments, each of the source electrode 112 and the drain electrode 114 may include Ti, Al, Au, Pd, other suitable metal, its alloy, or a combination thereof. In some embodiments, the electrode material is formed on the barrier layer 106 first by electroplating, sputtering, resistive heating evaporation, physical vapor deposition (PVD), chemical vapor deposition (CVD), atomic layer deposition (ALD), another suitable method, or a combination thereof. The electrode material is then patterned by a photolithography and an etching process, and the gate electrode 110, source electrode 112, and drain electrode 114 are formed.

Next, an enhancement layer 116 is formed on the barrier layer 106 between the gate electrode 110 and drain electrode 114. In some embodiments, the enhancement layer 116 is an N-type doped III-V semiconductor, including N-type doped GaN, AlGaN, AlN, GaAs, AlGaAs, InP, InAlAs, or InGaAs. The N-type doping concentration is between $1e17/cm^3$ and $1e20/cm^3$. The thickness of the enhancement layer 116 is between 0.1 µm and 1 µm. In some embodiments, the N-type doped III-V semiconductor is formed on the barrier layer 106 by molecular-beam epitaxy (MBE), metalorganic chemical vapor deposition (MOCVD), chemical vapor deposition (CVD), or hydride vapor phase epitaxy (HVPE). The enhancement layer 116 is then defined between the gate electrode 110 and the drain electrode 114 by patterning process (e.g., lithography process, etching process, or a combination thereof).

It should be noted that, in the present embodiment, the gate electrode 110, the source electrode 112, and the drain electrode 114 are formed first, and the enhancement layer 116 is formed later. However, the order of forming in the present embodiment is not limited. The enhancement layer 116 may be formed first, and the gate electrode 110, the source electrode 112, and the drain electrode 114 are formed later.

Figure 2:
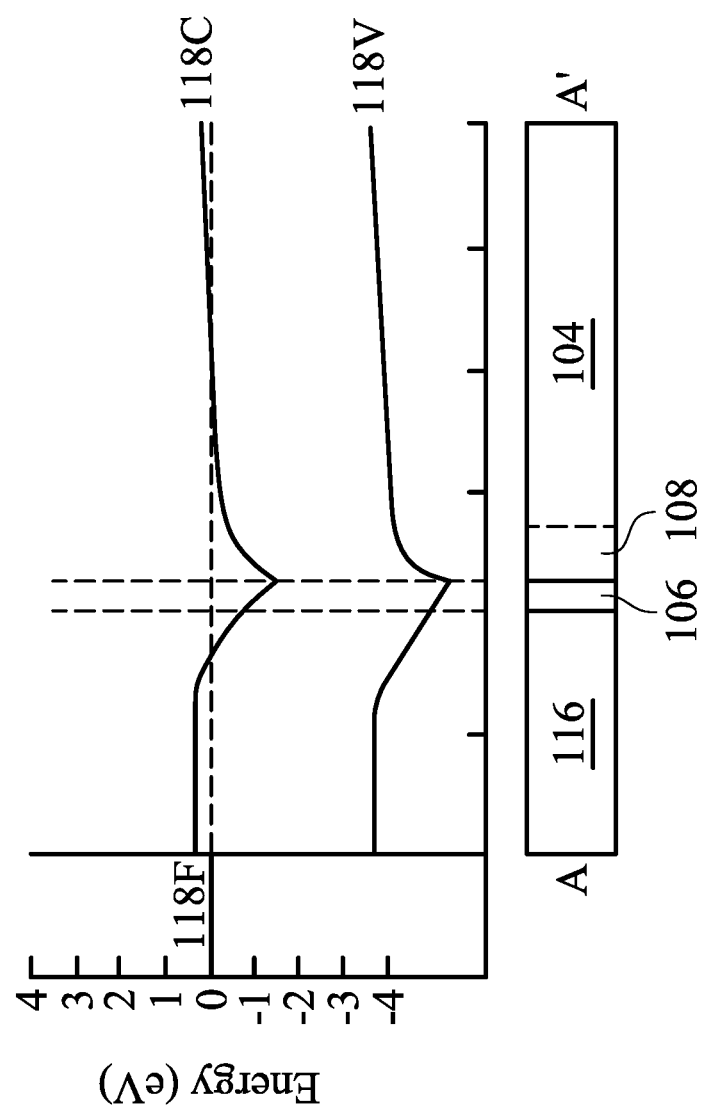
FIG. 2 is a band diagram of a high electron mobility transistor in accordance with some embodiments.

FIG. 2 is a band diagram of cross-sectional view along the line AA' in FIG. 1, which includes a conduction band 118C, a valence band 118V, and a Fermi level 118F. Since the enhancement layer 116 is an N-type doped III-V semiconductor, the N-type doping deepens the quantum well of the conduction band 118C at the interface between the buffer layer 104 and the barrier layer 106, and therefore the two-dimensional electron gas (2DEG) concentration below the Fermi level 118F in the channel layer 108 has increased, further enhancing the conducting current.

In the above embodiment, since the band gaps of the material of the buffer layer 104 and barrier layer 106 are different, the two-dimensional electron gas (2DEG) is formed at their interface, forming a conducting current in the channel layer 108. In this case, there is no need to apply gate voltage and the high electron mobility transistor 100 is turned on. Therefore, the high electron mobility transistor 100 is a depletion mode (D-mode) high electron mobility transistor.

As mentioned above, an enhancement layer is disposed on the barrier layer of a high electron mobility transistor. Since the band gap is changed by N-type doping, the depth of the quantum well is deepened. The two-dimensional electron gas (2DEG) concentration has increased, further enhancing the conducting current in the channel layer.

Figure 3:
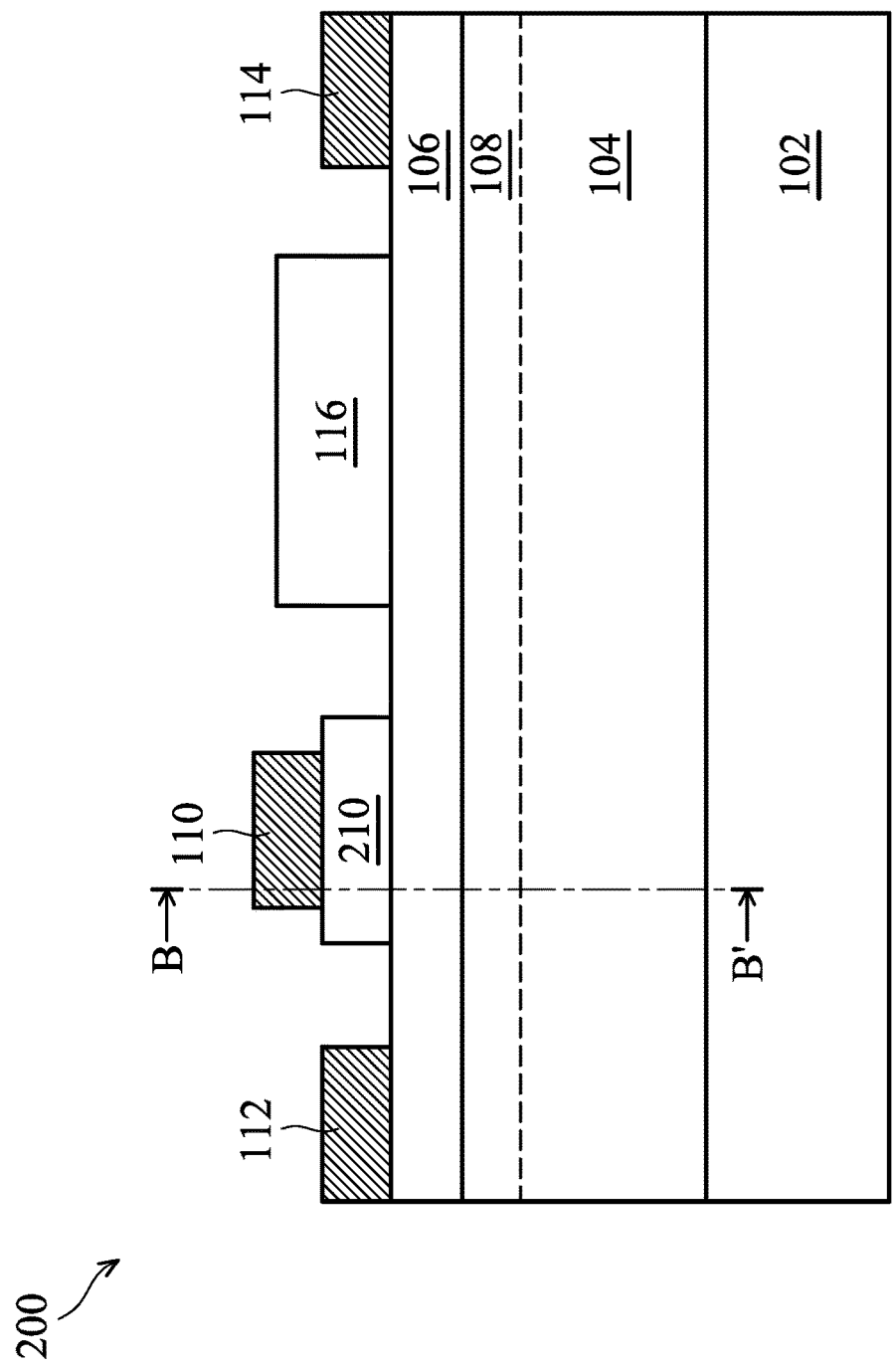
FIG. 3 is a cross-sectional representation of a high electron mobility transistor in accordance with some embodiments.

FIG. 3 is a cross-sectional representation of a high electron mobility transistor 200 in accordance with another embodiment of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that a band adjustment layer 210 is further disposed on the barrier layer 106 and is electrically connected to the gate electrode 110. The band adjustment layer 210 is a P-type doped III-V semiconductor, including P-type doped GaN, AlGaN, AlN, GaAs, AlGaAs, InP, InAlAs, or InGaAs. The P-type doping concentration is between $1e17/cm^3$ and $1e20/cm^3$. The thickness of the band adjustment layer 210 is between 0.1 µm and 1 µm. In some embodiments, before the gate electrode 110, the source electrode 112, and the drain electrode 114 are formed, the P-type doped III-V semiconductor is deposited by molecular-beam epitaxy (MBE), metalorganic chemical vapor deposition (MOCVD), chemical vapor deposition (CVD), or hydride vapor phase epitaxy (HVPE). The P-type doped III-V semiconductor is then patterned by such as photolithography and etching process to form the band adjustment layer 210. After the band adjustment layer 210 is formed, the gate electrode 110, the source electrode 112, and the drain electrode 114 are formed according to the method described in the embodiment above, electrically connecting the band adjustment layer 210 and the gate electrode 110.

Figure 4:
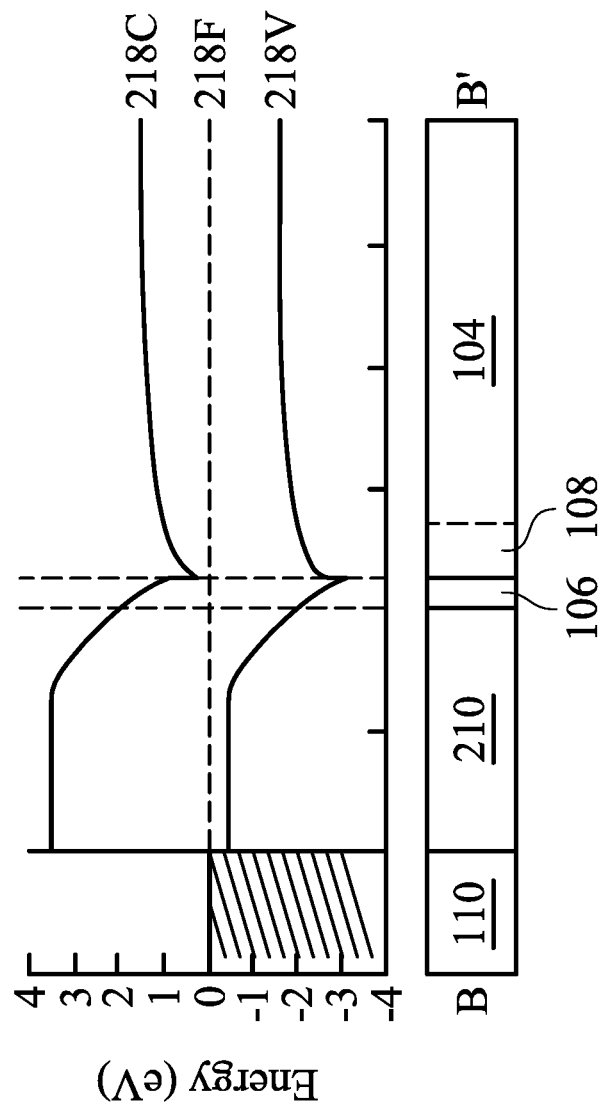
FIG. 4 is a band diagram of a high electron mobility transistor in accordance with some embodiments.

FIG. 4 is a band diagram of cross-sectional view along the line BB' in FIG. 3, which includes a conduction band 218C, a valence band 218V, and a Fermi level 218F. Since the band adjustment layer 210 is a P-type doped III-V semiconductor, the P-type doping raises the energy bands, therefore the energy of the quantum well at the interface between the buffer layer 104 and the barrier layer 106 is higher than the Fermi level 218F, which results in no two-dimensional electron gas (2DEG) is produced in the channel layer 108 and therefore no conducting current is produced.

In the embodiments described above, since the band adjustment layer 210 raises the energy band, the high electron mobility transistor 200 is cut off when no gate voltage is applied. Therefore, the high electron mobility transistor 200 is an enhancement mode (E-mode) high electron mobility transistor.

Compared to D-mode high electron mobility transistors, E-mode high electron mobility transistors are safer, and the standby power dissipation is lower. Since there is no need to apply a negative bias voltage, the circuit complexity and the production cost may also be reduced.

In the embodiments shown in FIG. 3, there is both a band adjustment layer 210 and an enhancement layer 116, each using different semiconductor materials to form a heterojunction, and the band structure is modified and the conducting current is effectively enhanced when the E-mode high electron mobility transistor 200 is turned on.

Figure 5:
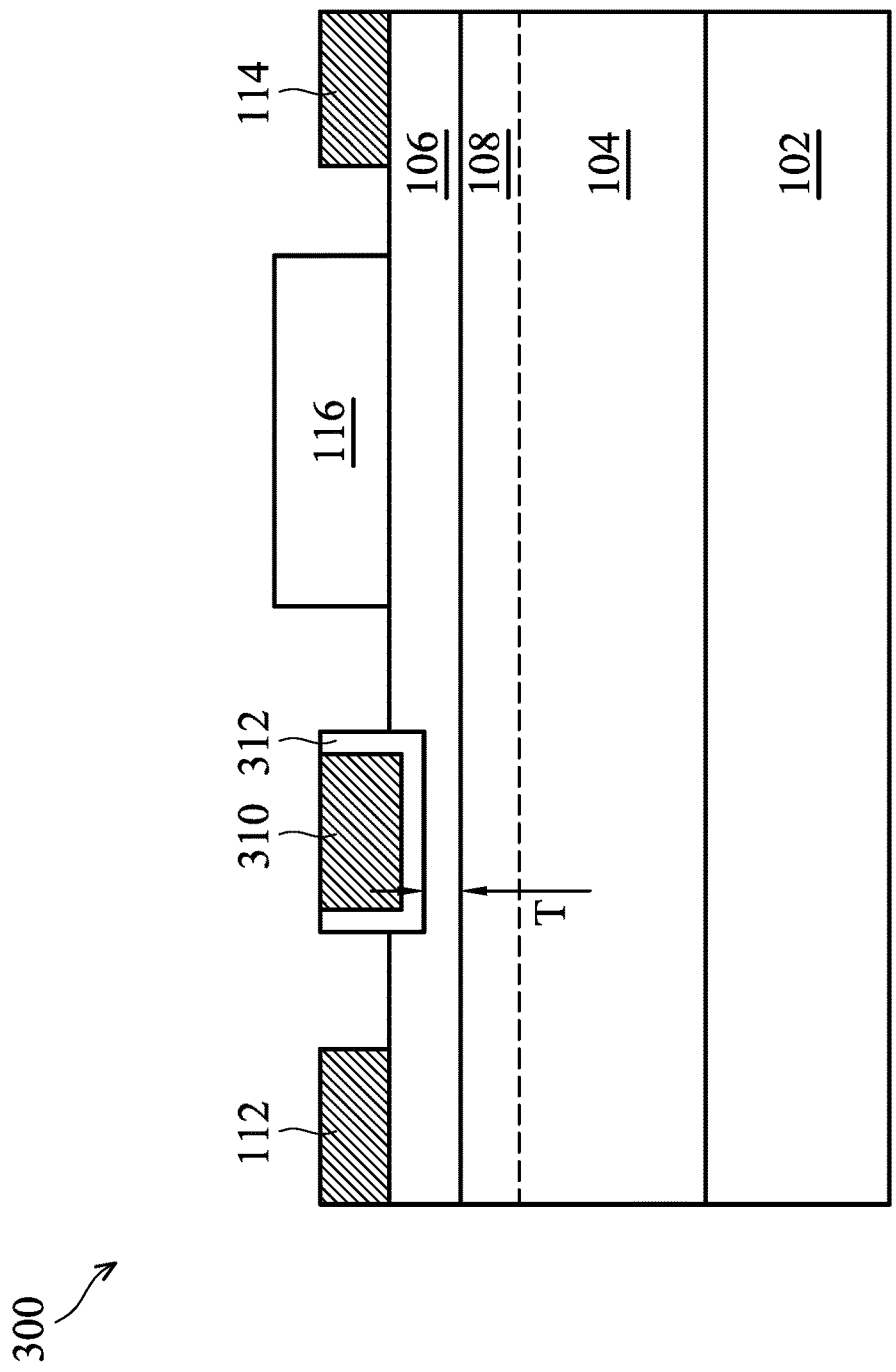
FIG. 5 is a cross-sectional representation of a high electron mobility transistor in accordance with some embodiments.

FIG. 5 is a cross-sectional representation of a high electron mobility transistor 300 in accordance with another embodiment of the present disclosure. Some processes or devices are the same as, or similar to, those used in the embodiments described above, and hence use the same symbols. For the purpose of brevity, descriptions of these processes and devices are not repeated herein. The difference from the above-mentioned embodiments is that the gate electrode 310 is embedded in the barrier layer 106. Before forming the gate electrode 310, one or more etching processes are performed to form a trench in the barrier layer 106. The conductive material is then filled in the trench by sputtering, resistive heating evaporation, e-beam evaporation, physical vapor deposition (PVD), chemical vapor deposition (CVD), atomic layer deposition (ALD), another suitable method, or a combination thereof. The conductive material is then patterned to form a gate electrode 310 embedded in the barrier layer 106.

As shown in FIG. 5, a dielectric layer 312 may be disposed between the gate electrode 310 and the barrier layer 106. The thickness of the dielectric layer 312 is between 0.1 μm and 1 μm. The dielectric layer 312 may include silicon oxide, $HfO_2$, HfSiO, HfSiON, HfTaO, HfSiO, HfZrO, LaO, ZrO, $Ta_2O_5$, a combination thereof, or similar material. In some embodiments, the dielectric layer 312 is formed before forming the gate electrode 310 by chemical vapor deposition (CVD), metalorganic chemical vapor deposition (MOCVD), plasma enhanced chemical vapor deposition (PECVD), high density plasma chemical vapor deposition (HDPCVD), atomic layer deposition (ALD), and/or other suitable techniques. The dielectric layer 312 may suppress the gate leakage current. If the dielectric layer 312 is too thick, the device speed may be impacted. If the dielectric layer 312 is too thin, the gate leakage current may be increased.

As shown in FIG. 5, since the gate electrode 310 is embedded in the barrier layer 106, compared to the embodiments shown in FIG. 1, the barrier layer 106 beneath the gate electrode 310 is thinner than the other parts. Piezoelectricity is restrained and the band structure of the heterojuction between the barrier layer 106 and the buffer layer 104 is changed. Therefore, the two-dimensional electron gas (2DEG) in the channel layer 108 is reduced. With appropriate selection of the gate electrode 310 material, the high electron mobility transistor 300 is cut off when no gate voltage is applied. Therefore, the high electron mobility transistor 300 is an enhancement mode (E-mode) high electron mobility transistor. In an embodiment, the thickness of the barrier layer 106 beneath the gate electrode 310 is T, and the thickness T is between 0.1 μm and 5 μm. If the thickness T is too thick, the two-dimensional electron gas (2DEG) in the channel layer 108 may not be reduced effectively, and the E-mode high electron mobility transistor may not be formed. If the thickness T is too thin, the band structure may be easily impacted by the thickness uniformity.

In the embodiments shown in FIG. 5, in addition to the enhancement layer 116, the gate electrode 310 is embedded in the barrier layer 106. In this way, the band structure is modified and the conducting current is effectively enhanced when the E-mode high electron mobility transistor 300 is turned on.

Figure 6:
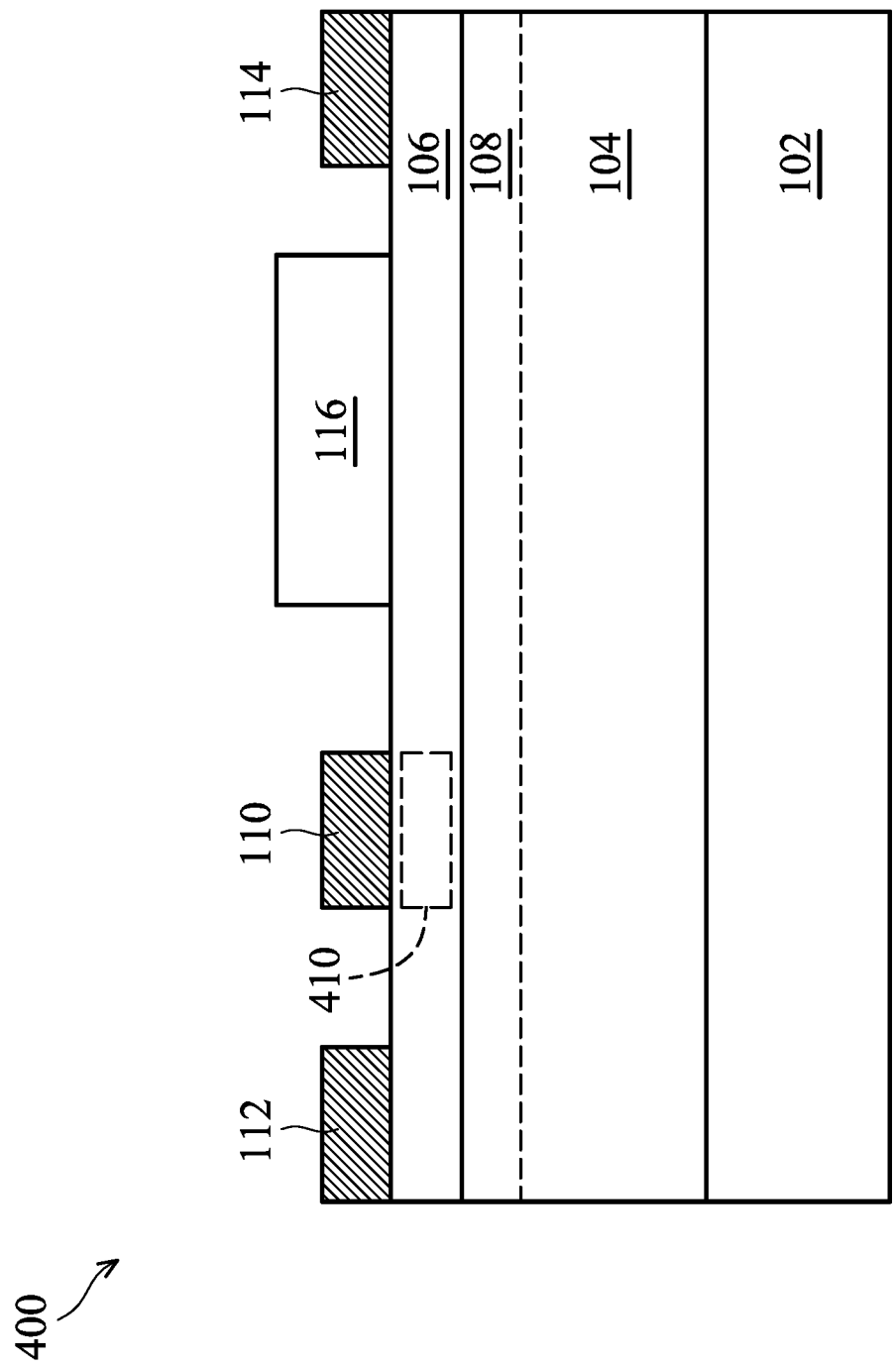
FIG. 6 is a cross-sectional representation of a high electron mobility transistor in accordance with some embodiments.

FIG. 6 is a cross-sectional representation of a high electron mobility transistor 400 in accordance with another embodiment of the present disclosure. Some processes or devices are the same as, or similar to, those used in the embodiments described above, and therefore use the same symbols. For the purpose of brevity, the descriptions of these processes and devices are not repeated herein. The difference from the embodiments described above is that a doping layer 410 is disposed in the barrier layer 106 beneath the gate electrode 110. In some embodiments, the doping layer 410 may be formed by an ion implantation process. For example, before the gate electrode 110 is formed, $F_2$, $CF_4$, or other fluoride-based ions are implanted in the barrier layer 106 beneath the gate electrode 110 by a patterned mask (not shown) to form the doping layer 410. The dopant concentration of the doping layer 410 is between 1e18/cm$^3$ and 1e20/cm$^3$.

As shown in FIG. 6, the doping layer 410 is disposed in the barrier layer 106 beneath the gate electrode 110, raising the band structure of the heterojuction between the barrier layer 106 and the buffer layer 104. Therefore, the two-dimensional electron gas (2DEG) in the channel layer 108 is reduced. In some embodiments, the high electron mobility transistor 400 is cut off when no gate voltage is applied. Therefore, the high electron mobility transistor 400 is an enhancement mode (E-mode) high electron mobility transistor.

In the embodiments shown in FIG. 6, in addition to the enhancement layer 116, the doping layer 410 is disposed in the barrier layer 106 beneath the gate electrode 110. In this way, the band structure is modified and the conducting current is effectively enhanced when the E-mode high electron mobility transistor 400 is turned on.

Figure 7:
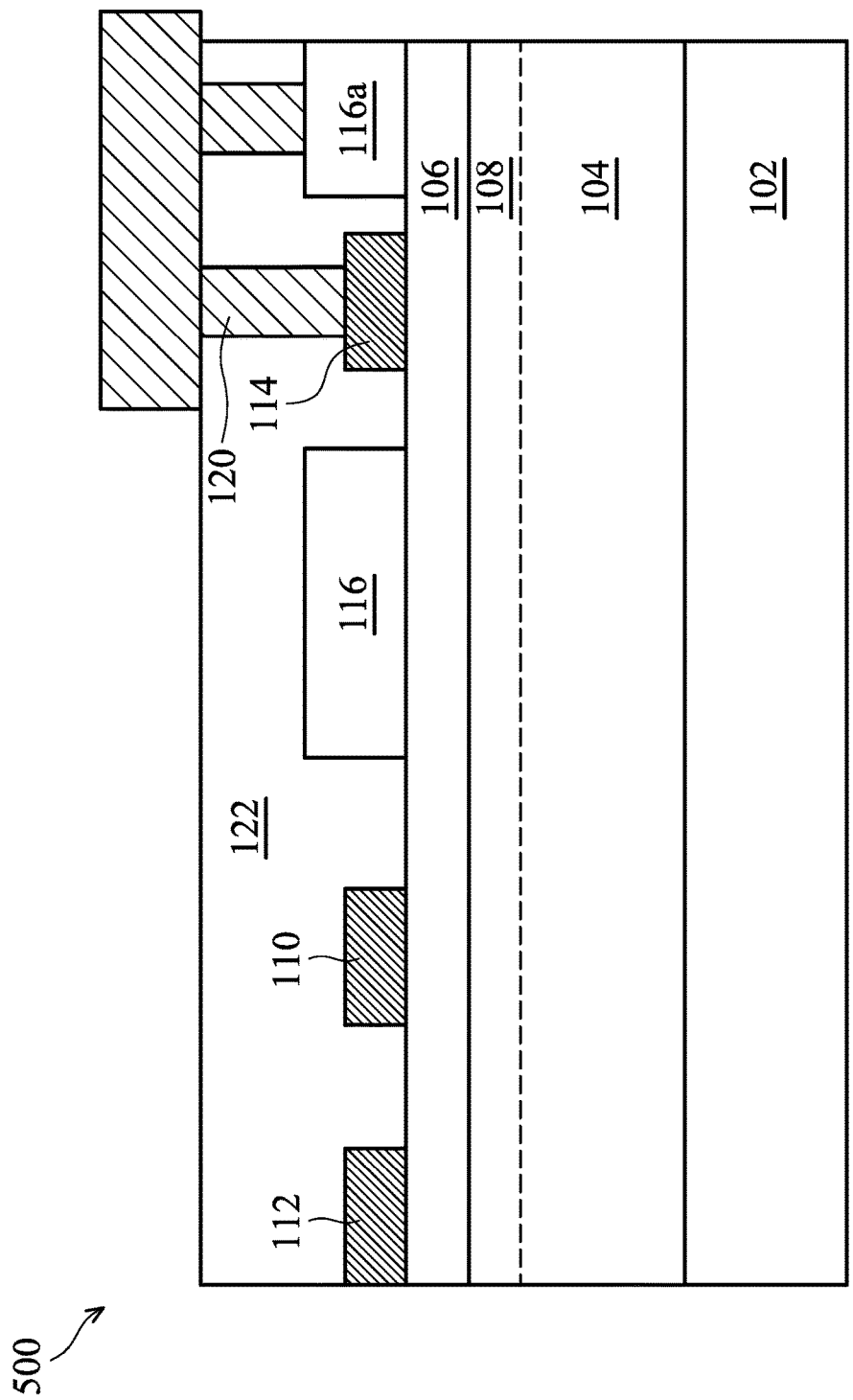
FIG. 7 is a cross-sectional representation of a high electron mobility transistor in accordance with some embodiments.

FIG. 7 is a cross-sectional representation of a high electron mobility transistor 500 in accordance with another embodiment of the present disclosure. Some processes or devices are the same as, or similar to, those used in the embodiments described above, and so they use the same symbols. As such, their descriptions are not repeated herein. The difference from the embodiments described above is that, as well as having one enhancement layer 116 between the gate electrode 110 and the drain electrode 114, an additional enhancement layer 116a is formed on the barrier layer 106 in the same step in which the enhancement layer 116 is formed. Next, an interconnect process is performed to form an inter-layer dielectric (ILD)/inter-metal dielectric (IMD) 122, in/on which an interconnect structure 120 is formed. The enhancement layer 116a and the drain electrode 114 is electrically connected by the interconnect structure 120. The interconnect structure 120 may be formed by etching and deposition processes with a patterned mask (not shown). Examples of an etching process include selective wet etching, selective dry etching, and combinations thereof. The deposition process may be sputtering, resistive heating evaporation, e-beam evaporation, physical vapor deposition (PVD), another suitable method, or a combination thereof. The material of the interconnect structure 120 may include Al, Ag, Cu, AlCu, Pt, W, Ru, Ni, TaN, TiN, TiAlN, TiW, and combinations thereof. The interconnect structure 120 may include various metal lines, contacts, vias, and combinations thereof.

It should be noted that the FIG. 7 is only an exemplary cross-sectional view. The embodiments of the present disclosure does not limit to an electrical connection between the enhancement layer 116a and the drain electrode 114. The enhancement layer 116a may also be electrically connected to the gate electrode 110 or the source electrode 112, or any electrical connecting approach using the enhancement layer 116a as a resistor, depending on the demand of the circuit design.

In some embodiments, the enhancement layer 116a is electrically connected to the gate electrode 110, or the drain electrode 114, or the source electrode 112. The enhancement layer 116a is used as a resistor herein. For the D-mode high electron mobility transistor 500, the enhancement layer 116 for enhancing conducting current and the enhancement layer 116a as a resistor are formed at the same process step. In this way, the production cost and time may be saved.

It should be noted that the enhancement layer 116a may also be formed in the E-mode high electron mobility transistor 200, 300, and 400 as shown in FIG. 3, FIG. 5, and FIG. 6. The enhancement layer 116 for enhancing conducting current and the enhancement layer 116a as a resistor are formed at the same process step. In this way, the production cost and time may be saved.

As mentioned above, the present disclosure provides a high electron mobility transistor (HEMT) structure. The enhancement layer is formed above the channel layer. By modifying the band structure, the two-dimensional electron gas (2DEG) concentration has increased, and then the conducting current of the depletion mode (D-mode) high electron mobility transistor and the enhancement mode (E-mode) high electron mobility transistor is enhanced. A resistor may also be formed at the same process step.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT), comprising:
   a buffer layer disposed on a substrate;
   a barrier layer disposed on the buffer layer;
   a channel layer disposed in the buffer layer adjacent to an interface between the buffer layer and the barrier layer;
   a gate electrode disposed on the barrier layer;
   a drain electrode disposed on the barrier layer on a first side of the gate electrode;
   a source electrode disposed on the barrier layer on a second side of the gate electrode, wherein the first side is opposite the second side; and
   a first enhancement layer disposed on the barrier layer and the channel layer between the gate electrode and the drain electrode, wherein the first enhancement layer is not in direct contact with the gate electrode, the source electrode, and the drain electrode;
   wherein the first enhancement layer is an N-type doped III-V semiconductor.

2. The high electron mobility transistor as claimed in claim 1, wherein the first enhancement layer comprises N-type doped GaN, AlGaN, AlN, GaAs, AlGaAs, InP, InAlAs, or InGaAs.

3. The high electron mobility transistor as claimed in claim 1, wherein an N-type dopant concentration of the first enhancement layer is between $1e17/cm^3$ and $1e20/cm^3$.

4. The high electron mobility transistor as claimed in claim 1, further comprising:
   a band adjustment layer disposed on the barrier layer and electrically connected to the gate electrode;
   wherein the band adjustment layer is a P-type doped III-V semiconductor.

5. The high electron mobility transistor as claimed in claim 4, wherein the band adjustment layer comprises P-type doped GaN, AlGaN, AlN, GaAs, AlGaAs, InP, InAlAs, or InGaAs.

6. The high electron mobility transistor as claimed in claim 4, wherein a P-type dopant concentration of the band adjustment layer is between $1e17/cm^3$ and $1e20/cm^3$.

7. The high electron mobility transistor as claimed in claim 1, wherein the gate electrode is embedded in the barrier layer.

8. The high electron mobility transistor as claimed in claim 7, wherein a thickness of the barrier layer beneath the gate electrode is between 0.1 μm and 1 μm.

9. The high electron mobility transistor as claimed in claim 7, further comprising:
   a dielectric layer disposed between the gate electrode and the barrier layer.

10. The high electron mobility transistor as claimed in claim 1, further comprising:
    a doping layer disposed in the barrier layer beneath the gate electrode;
    wherein the doping layer comprises fluorine (F).

11. The high electron mobility transistor as claimed in claim 10, wherein a dopant concentration of the band adjustment layer is between $1e18/cm^3$ and $1e20/cm^3$.

12. The high electron mobility transistor as claimed in claim 1, further comprising:
    a second enhancement layer disposed on the barrier layer; and
    an interconnect structure connecting the second enhancement layer and the gate electrode, or the drain electrode, or the source electrode.

13. The high electron mobility transistor as claimed in claim 1, wherein the substrate comprises Si, SiC, or $Al_2O_3$.

\* \* \* \* \*